United States Patent
Chen

(10) Patent No.: US 8,089,311 B2
(45) Date of Patent: Jan. 3, 2012

(54) SIGNAL AMPLIFIER

(75) Inventor: Baoxing Chen, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 42 days.

(21) Appl. No.: 12/009,765

(22) Filed: Jan. 22, 2008

(65) Prior Publication Data

US 2009/0184754 A1   Jul. 23, 2009

(51) Int. Cl.
G06G 7/12 (2006.01)

(52) U.S. Cl. .......................................... 327/560; 327/562

(58) Field of Classification Search .......... 327/560–563, 327/55, 57; 330/252, 253
See application file for complete search history.

(56) References Cited

U.S. PATENT DOCUMENTS

| | | | |
|---|---|---|---|
| 3,583,378 A * | 6/1971 | Pattee | 123/598 |
| 3,736,434 A * | 5/1973 | Darrow | 327/63 |
| 3,875,483 A * | 4/1975 | Farr | 318/807 |
| 4,024,452 A | 5/1977 | Seidel | |
| 4,742,470 A * | 5/1988 | Juengel | 700/175 |
| 4,785,345 A | 11/1988 | Rawls et al. | |
| 5,469,098 A | 11/1995 | Johnson, Jr. | |
| 5,650,357 A | 7/1997 | Dobkin et al. | |
| 5,701,037 A | 12/1997 | Weber et al. | |
| 5,774,350 A | 6/1998 | Notaro et al. | |
| 5,777,861 A * | 7/1998 | Shimizu et al. | 363/37 |
| 5,781,077 A | 7/1998 | Leitch et al. | |
| 2006/0120115 A1 * | 6/2006 | Chen et al. | 363/17 |
| 2008/0231383 A1 * | 9/2008 | Chang et al. | 331/108 R |
| 2009/0184774 A1 * | 7/2009 | Deng et al. | 331/117 FE |

FOREIGN PATENT DOCUMENTS

| | | |
|---|---|---|
| GB | 1 248 209 | 9/1971 |
| WO | WO 99/21332 | 4/1999 |
| WO | WO 2007/049898 | 5/2007 |

OTHER PUBLICATIONS

G. Knoedl, Jr., et al., "A Monolithic Signal Isolator", IEEE, 1989, pp. 165-170.
International Search Report dated Mar. 26, 2009, in counterpart International application No. PCT/US2009/031555.

* cited by examiner

Primary Examiner — Long Nguyen
(74) Attorney, Agent, or Firm — Kenyon & Kenyon LLP

(57) ABSTRACT

A signal amplifier including a transformer with a primary winding and a secondary winding, an oscillator circuit driven by an input signal establishing in the primary winding an oscillating signal amplified by the secondary, and a rectifier circuit responsive to the secondary winding configured to convert the amplified oscillating signal to an amplified version of the input signal.

18 Claims, 4 Drawing Sheets

SIGNAL AMPLIFIER

FIELD OF THE INVENTION

This subject invention relates to a signal amplifier.

BACKGROUND OF THE INVENTION

A charge pump is an electronic circuit that uses capacitors as energy storage elements to create a higher voltage than the supply voltage from which they operate. The voltage output of a charge pump is a function of the number of pump stages. But, increasing the number of pump stages increases the complexity of the charge pump. Charge pumps in general also suffer from long start up times. Moreover, integration of a traditional charge pump can be difficult and charge pumps can be costly and suffer from sub-optimal efficiencies.

BRIEF SUMMARY OF THE INVENTION

It is therefore an object of this invention to provide a new signal amplifier.

It is a further object of this invention to provide such a signal amplifier which does not include traditional capacitors in numerous pump stages.

It is a further object of this invention to provide such a signal amplifier which is less complex.

It is a further object of this invention to provide such a new signal amplifier which is more easily integrated with other circuitry.

It is a further object of this invention to provide such a signal amplifier which has a shorter startup time.

It is a further object of this invention to provide such a signal amplifier which is less costly and more efficient.

The subject invention results from the realization, in part, that by employing a micro-transformer primary in which an oscillating signal is established driven by switches responsive to an input signal, the input signal is amplified by the secondary of the micro-transformer and this amplified signal can be rectified to produce an amplified version of the input signal.

The subject invention, however, in other embodiments, need not achieve all these objectives and the claims hereof should not be limited to structures or methods capable of achieving these objectives.

The subject invention features a signal amplifier comprising a transformer with a primary winding and a secondary winding, an oscillator circuit driven by an input signal establishing in the primary winding an oscillating signal amplified by the secondary, and a rectifier circuit responsive to the secondary winding configured to convert the amplified oscillating signal to an amplified version of the input signal.

In one example, the oscillator circuit includes a cross-coupled switch pair. The switches can be transistors with their sources connected to the input signal, their drains connected across the primary winding, and the gate of each transistor connected to the drain of the other. One oscillator circuit includes two cross-coupled switched pairs. The first switch pair includes transistors with their sources connected to the input signal, their drains connected across the primary winding, and the gate of each transistor connected to the drain of the other. The second switch pair includes transistors with their sources connected to the drains of the first switch pair, their drains interconnected, and the gate of each transistor connected to the source of the other. The first switch pair may be PMOS transistors and the transistors of the second switch pair may be NMOS transistors.

One typical rectifier circuit includes diodes. One side of the secondary is connected between two diodes and the other side of the secondary is connected between first and second capacitors. The diodes and the capacitors are connected in parallel. A third capacitor can be connected in parallel with the first and second capacitors.

One signal amplifier further includes a switch circuit in parallel with the third capacitor to control discharging of the third capacitor producing the amplified version of the input signal. The switching circuit may include a transistor and/or a resistor.

One preferred oscillator circuit may include a switch actuated by the input signal and coupled to a voltage source. The transformer may be a micro-transformer. The oscillator circuit may have a frequency higher than the frequency of the input signal.

One example of a signal amplifier in accordance with this invention includes a transformer with a primary winding and a secondary winding, and cross-coupled switching devices responsive to an input signal and connected across the primary winding switching each other on and off establishing an oscillating signal in the primary winding which is amplified by the secondary winding, and a circuit is responsive to the secondary winding and is configured to convert the amplified oscillating signal to an amplified version of the input signal.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
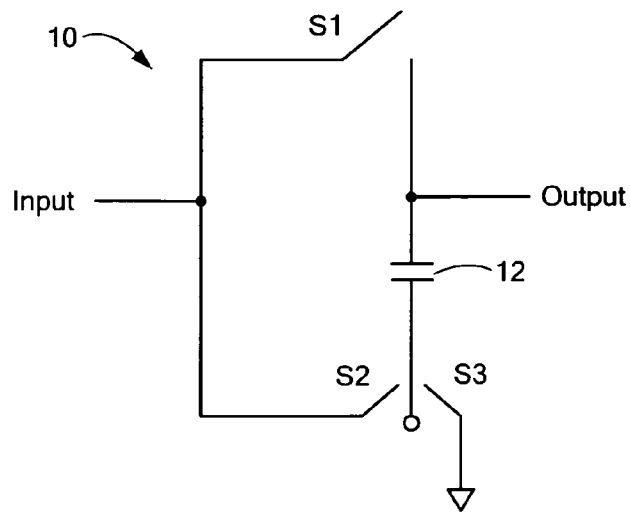
FIG. 1 is a highly schematic circuit diagram showing a simple prior art charge pump.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 shows a simple prior art charge pump 10 with capacitor 12 and switches $S_1$ and $S_3$. Closing switches $S_1$ and $S_3$ and then closing switch $S_2$ results in an output voltage greater than the input voltage. To further increase the amplitude of the output signal, additional capacitors are cascaded in series.

But, as noted in the background section above, the result is increased complexity, long start up times, more difficulty in integrating the charge pump with other circuitry, lower efficiency, and a higher cost.

Figure 2:
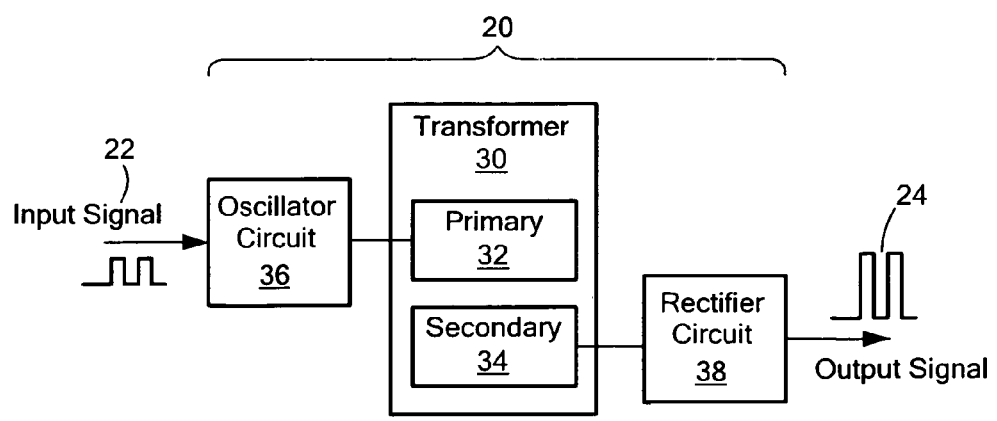
FIG. 2 is a schematic block diagram showing the primary components associated with a signal amplifier in accordance with one embodiment of the subject invention.

The subject invention, in one embodiment, features a signal amplifier 20, FIG. 2 which amplifies input signal 22 to produce an amplified output signal 24.

Transformer 30, typically a micro-transformer integrated on one or more integrated circuits substrates, includes primary 32 and secondary 34. Typically, the turn to turn ratio is greater than 1. In general, in accordance with the subject invention, signals can be amplified beyond supply rails by using micro-transformers without the need for an additional high voltage supply. Transformers are superior for large voltage 15 step up ratios and energy conservation. But, micro-transformers can be lossy and may be easily current saturated. The benefit of micro-transformers, however, is that they have very small parasitics and are suitable for high frequency switching.

Thus, oscillator circuit 36 is driven by input signal 22 and establishes in primary winding 32 an oscillating signal having a frequency higher than the frequency of input signal 22. The oscillating signal is amplified by secondary winding 34. Rectifier circuit 38 is responsive to secondary winding 34 and is configured to convert the amplified oscillating signal to an amplified version 24 of input signal 22.

Figure 3:
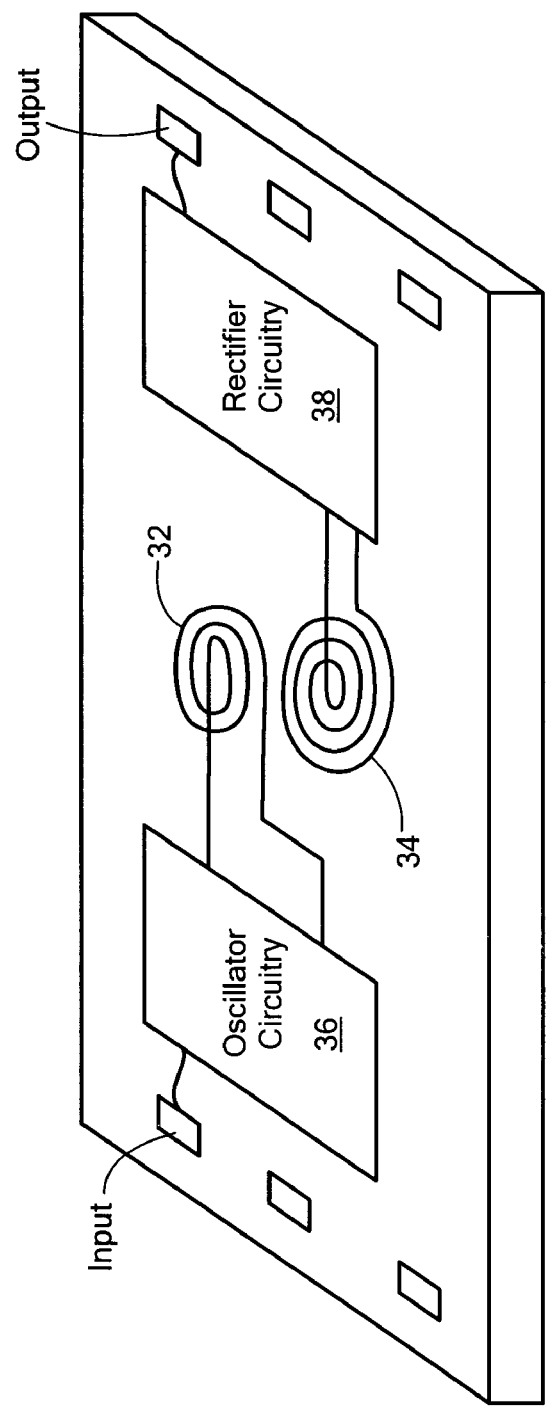
FIG. 3 is a highly schematic view showing how the components of the signal amplifier shown in FIG. 2 can be embodied on a single (or multiple) substrates or electronic chips in accordance with the subject invention.

In one example, primary winding 32 and secondary winding 34 (as well as oscillator circuit 36 and rectifier circuit 38) are integrated on one or more integrated circuit substrates also including other circuitry as shown in FIG. 3. See U.S. Pat. No. 7,075,329 and U.S. Pat. No. 6,291,907 incorporated herein by this reference.

Figure 4:
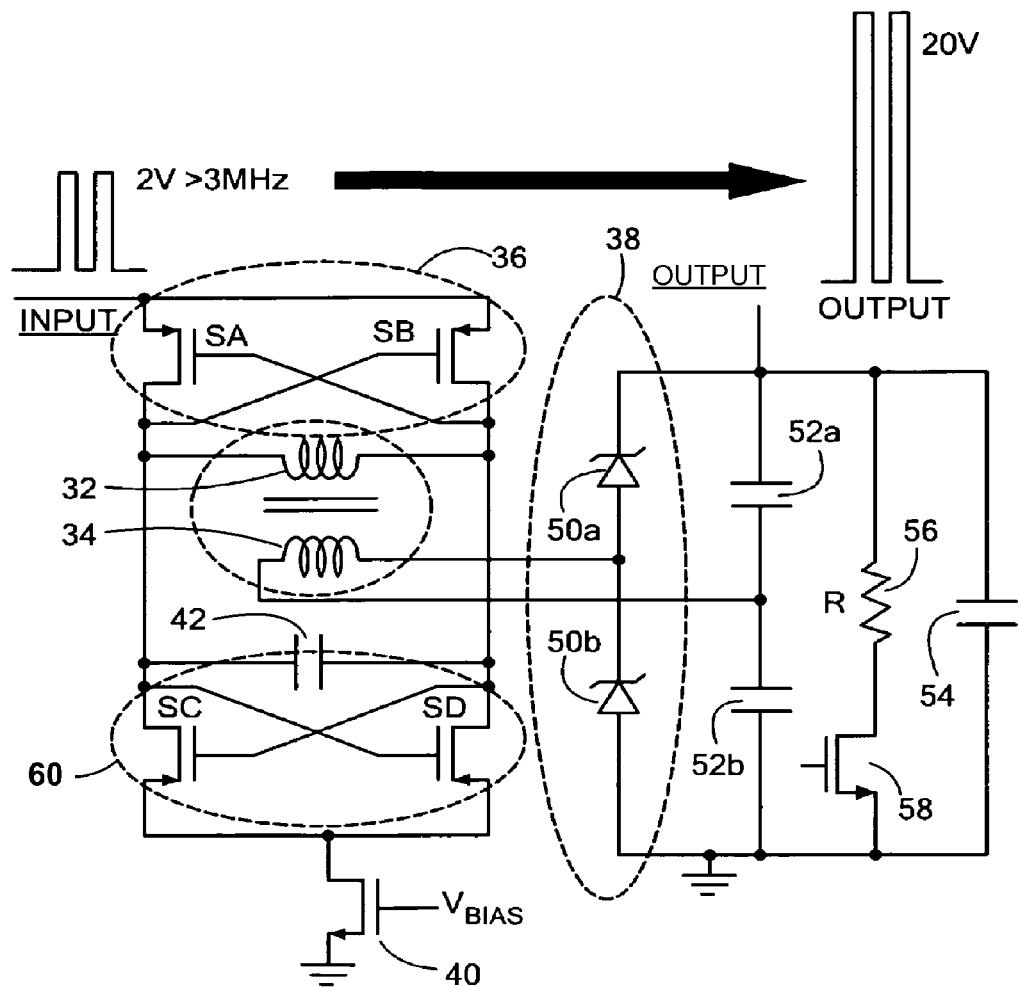
FIG. 4 is a schematic circuit diagram showing an example of a signal amplifier in accordance with the subject invention.

In one embodiment, oscillator circuit 36, FIG. 4 includes cross-coupled switch pair $S_A$ and $S_B$, e.g., PMOS transistors with their sources connected to receive input signal 22, and their drains connected across primary winding 32 as shown. The gate of transistor $S_A$ is connected to the drain of transistor $S_B$ and the gate of transistor $S_B$ is connected to the drain of transistor $S_A$ so that when transistor $S_A$, when switched on, switches transistor $S_B$ off and transistor $S_B$, when switched on, switches transistor $S_A$ off. This effect establishes an oscillating AC current signal in primary winding 32.

Another cross-coupled switch pair 60 is shown constructed from NMOS transistors $S_C$ and $S_D$. The sources, drains, and gates of transistor $S_C$ and transistor $S_D$ are connected so that transistor $S_A$ and transistor $S_D$ switch on and off at the same time and transistor $S_B$ and transistor $S_C$ switch on and off at the same time. Capacitor 42 is used to form LC oscillation and it can be the parasitic capacitance from switches SA, SB, SC, and SD. Transistor 40 is used to provide bias current to the LC tank circuit. It can control the oscillator amplitude when the oscillator operates in current limited region. If the oscillator operates in voltage limited region, the oscillation amplitude will be determined by the amplitude of input 22. For FIG. 4, it is desired that the oscillator operates in voltage limited region such that the oscillation amplitude is directly proportional to the amplitude of input 22. External signals can be used to modulate high frequency switching signals and the modulated signals can be rectified to reproduce the amplified signals.

A preferred rectifier circuit 38 includes Schottky diodes 50a and 50b in series and a node therebetween connected to one side of secondary 34. The other side of secondary 34 is connected between series capacitors 52a and 52b connected in parallel with diodes 50a and 50b. Capacitor 54 is connected in parallel with series resistor 56 and switch 58. Optional transistor 58 can be used to control the discharge rate of capacitor 54 or to prevent the discharge of capacitor 54 through resistor 56. Capacitors 52a and 52b form a capacitive doubler to double the rectified and amplified signal.

Figure 5:
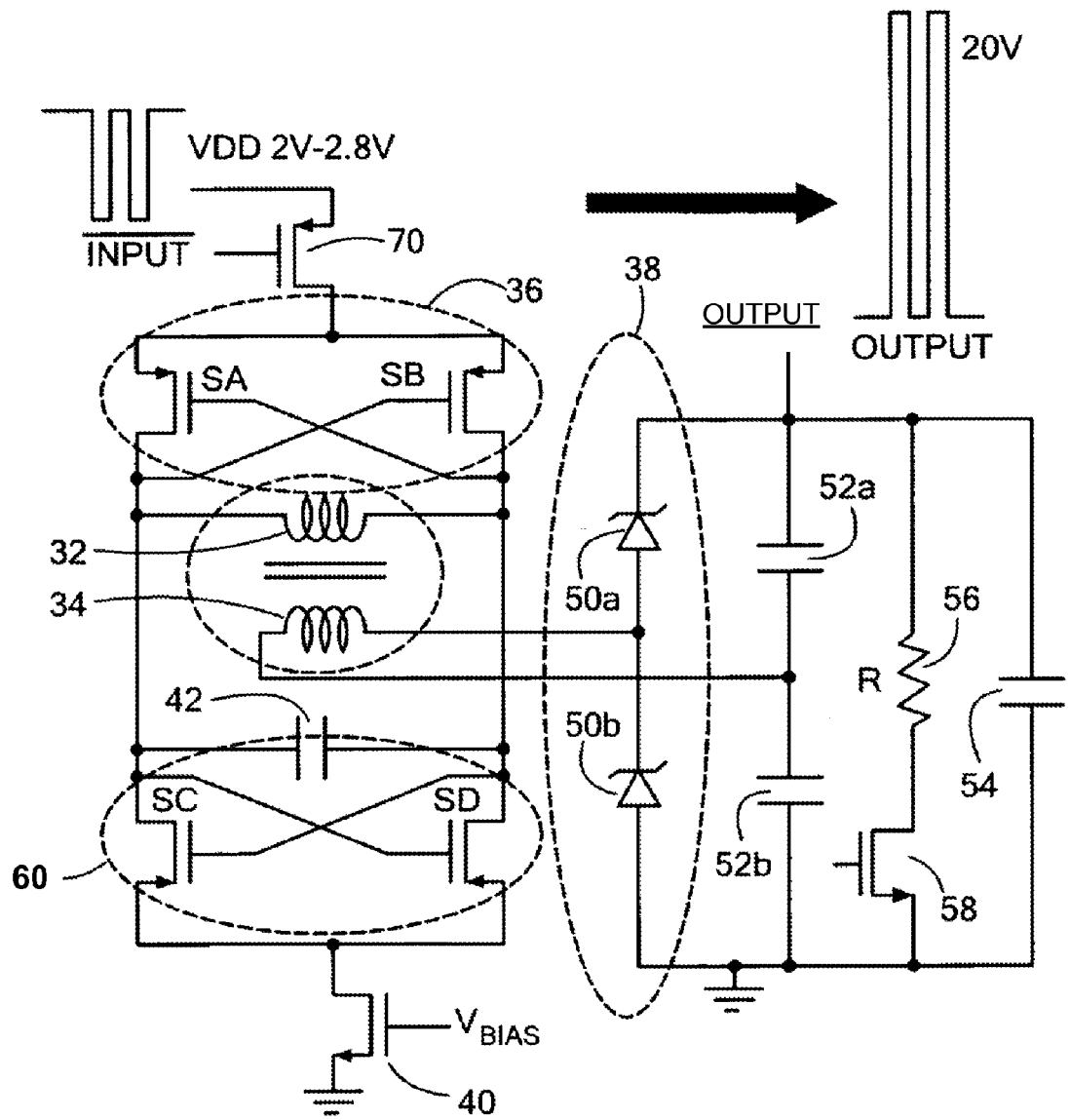
FIG. 5 is a schematic circuit diagram showing another example of a signal amplifier in accordance with the subject invention.

FIG. 5 shows the addition of an input transistor 70 with its gate coupled to the input signal, its source connected to a voltage $V_{DD}$, and its drain connected to the sources of transistor pair $S_A$ and $S_B$. The switching amplitude can be controlled to be proportional to the input by setting the bias current into the tank circuit that switches the transformers.

In this way, signals can be amplified using micro-transformers without the need for an additional high voltage power supply. The oscillating circuit signal established in the micro-transformer primary in response to an input signal is amplified by the secondary of the micro-transformer and this amplified signal can then be rectified to produce an out amplified version of the input signal.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A signal amplifier comprising:
   a transformer with a primary winding and a secondary winding;
   an oscillator circuit having an input, the oscillator to establish in the primary winding an oscillating signal, the oscillator including a pair of switches connected to each other in series across terminals of the primary winding, the switches connected to the oscillator input at an intermediate node between them, each switch having a control input connected to terminal of the primary winding to which its counterpart switch is connected; and
   a rectifier circuit coupled to terminals of the secondary winding, wherein the rectifier circuit includes diodes, and one side of the secondary winding is connected between two diodes and the other side of the secondary winding is connected between first and second capacitors.

2. A signal amplifier comprising:
   a transformer with a primary winding and a secondary winding;
   an oscillator circuit driven by an input signal establishing in the primary winding an oscillating signal that is amplified by the secondary winding, the oscillator circuit including a first and second cross-coupled switched pairs; and a rectifier circuit coupled to the secondary winding configured to convert the amplified oscillating signal to an amplified version of the input signal, wherein the rectifier circuit includes diodes and one side of the secondary winding is connected between two diodes and the other side of the secondary winding is connected between first and second capacitors.

3. The signal amplifier of claim 2 in which the first switch pair includes transistors with their sources connected to the input signal, their drains connected across the primary winding, and the gate of each transistor connected to the drain of the other.

4. The signal amplifier of claim 3 in which the second switch pair includes transistors with their drains connected to the drains of the first switch pair, their sources interconnected, and the gate of each transistor connected to the drain of the other.

5. The signal amplifier of claim 4 in which the transistors of the first switch pair are PMOS transistors and the transistors of the second switch pair are NMOS transistors.

6. The signal amplifier of claim 2 in which the diodes and the capacitors are connected in parallel.

7. The signal amplifier of claim 6 further including a third capacitor connected in parallel with the first and second capacitors.

8. The signal amplifier of claim 7 further including a switch circuit in parallel with the third capacitor to control discharging of the third capacitor producing the amplified version of the input signal.

9. The signal amplifier of claim 8 in which the switching circuit includes a transistor and a resistor in series.

10. The signal amplifier of claim 8 in which the switching circuit includes a transistor.

11. The signal amplifier of claim 8 in which the switching circuit includes a resistor.

12. The signal amplifier of claim 2 in which the oscillator circuit further includes a switch actuated by the input signal and coupled to a voltage source.

13. The signal amplifier of claim 2 in which the transformer is a micro-transformer.

14. The signal amplifier of claim 2 in which the oscillator circuit has a frequency higher than the frequency of the input signal.

15. A signal amplifier comprising:
a transformer with a primary winding and a secondary winding;
two pairs of cross-coupled switching devices with a first pair of the two pairs coupled to an input signal terminal to establish an oscillating signal in the primary winding which is amplified by the secondary winding, the two devices of each pair connected across the primary winding switching each other on and off; and
a circuit coupled to the secondary winding configured to convert the amplified oscillating signal to an amplified version of the input signal, wherein one side of the secondary is connected between two diodes and the other side of the secondary is connected between the first and second capacitors, the diodes and the capacitors are connected in parallel.

16. The signal amplifier of claim 15, wherein the input signal is received by the first pair of the switching devices via an input transistor, the source of the input transistor is connected to a positive voltage and the gate of the input transistor is connected to an input signal line.

17. The signal amplifier of claim 15, further comprising:
a third capacitor connected in parallel with the first and second capacitors;
a switch circuit in parallel with the third capacitor to control discharging of the third capacitor producing the amplified version of the input signal.

18. The signal amplifier of claim 15, wherein the oscillating signal has a frequency higher than the frequency of the input signal.

* * * * *